(12) United States Patent
Baudelot et al.

(10) Patent No.: US 6,614,281 B1
(45) Date of Patent: Sep. 2, 2003

(54) METHOD AND DEVICE FOR DISCONNECTING A CASCODE CIRCUIT WITH VOLTAGE-CONTROLLED SEMICONDUCTOR SWITCHES

(75) Inventors: Eric Baudelot, Weisendorf (DE); Manfred Bruckmann, Nürnberg (DE); Heinz Mitlehner, Uttenreuth (DE); Benno Weis, Hemhofen (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 10/009,001

(22) PCT Filed: May 29, 2000

(86) PCT No.: PCT/DE00/01739

§ 371 (c)(1),
(2), (4) Date: Dec. 6, 2001

(87) PCT Pub. No.: WO00/77934

PCT Pub. Date: Dec. 21, 2000

(30) Foreign Application Priority Data

Jun. 11, 1999 (DE) .......................................... 199 26 715

(51) Int. Cl.[7] .................................................. H03L 5/00
(52) U.S. Cl. ...................................... 327/321; 327/332
(58) Field of Search .................................. 327/309, 321, 327/322, 331, 332, 430; 361/56, 91

(56) References Cited

U.S. PATENT DOCUMENTS 4,228,367 A * 10/1980 Brown ........................ 327/374
4,480,201 A    10/1984 Jaeschke

FOREIGN PATENT DOCUMENTS

| DE | 4325899 | 8/1993 |
| DE | 19610135 | 3/1996 |
| DE | 19742019 | 9/1997 |

* cited by examiner

*Primary Examiner*—Kenneth B. Wells
(74) *Attorney, Agent, or Firm*—Baker Botts LLP

(57) ABSTRACT

A method and an apparatus for turning off a cascode circuit comprising a series circuit formed by a low-blocking-capability and high-blocking-capability semiconductor switch, are described. When a turn-off command arrives, the gate voltage of the low-blocking-capability semiconductor switch is controlled in such a way that its drain voltage is held constant in the active range of the low-blocking-capability semiconductor switch. Consequently, an impermissible overvoltage at high potential of the cascode circuit at low potential is detected and actively limited.

10 Claims, 6 Drawing Sheets

METHOD AND DEVICE FOR DISCONNECTING A CASCODE CIRCUIT WITH VOLTAGE-CONTROLLED SEMICONDUCTOR SWITCHES

FIELD OF THE INVENTION

The invention relates to a method and an apparatus for turning off a cascode circuit comprising a series circuit formed by a low-blocking-capability and high-blocking-capability semiconductor switch.

BACKGROUND OF THE INVENTION

In power electronic circuits, because of internal switching actions or external mains overvoltages, voltage values can occur across power semiconductors which exceed their rated blocking capability. Since the occurrence of such operating states cannot be precluded, an elementary requirement for protecting power semiconductor elements is the ability to withstand overvoltages, in order to avoid destruction of the semiconductor components or more extensive damage.

For this problem, two possible solutions currently exist, namely passive and active overvoltage limiting.

Passive overvoltage limiting employs a capacitor which is electrically connected in parallel with the power semiconductor. This protective circuit is also referred to as a clamp circuit. By means of this clamp circuit, the energy of the overvoltage is conducted into the capacitor, thereby limiting a voltage rise at the power semiconductor switch. This capacitor may additionally be augmented by a resistor and a diode to form a so-called RCD protective circuit, which is also referred to as a snubber circuit. The disadvantage of the clamp protective circuit or of the snubber circuit is that the capacitor has to be designed for the maximum voltage that occurs. Such a capacitor is costly and occupies a comparatively large structural volume. Furthermore, the leakage inductance of the protective circuit will increase because of the large structural volume and the longer connection lines resulting therefrom. If no further outlay is to be expended, the energy stored in the capacitor is converted into heat by means of the protective circuit resistor, as a result of which this positive overvoltage protection causes a non-negligible power loss.

In the case of active overvoltage protection, an overvoltage that occurs at the power semiconductor is detected and compared with a limit value which is less than a maximum reverse voltage of the power semiconductor, and the power semiconductor is actively driven as soon as the overvoltage exceeds the predetermined limit value. As a result of the active driving, the power semiconductor is able to convert the energy of the overvoltage into heat by an elevated current flowing through the power semiconductor at high voltage. An overvoltage can be identified by a voltage-limiting component, for example a zener diode, which carries a current in the reverse direction when its zener voltage is exceeded. This current can be passed directly or via an amplifier into the control terminal of the power semiconductor in order to turn the latter on. In this arrangement, a high-voltage zener diode is required. Instead of a high-blocking-capability zener diode, it is also possible to use a high-impedance voltage divider for identifying the overvoltage. The disadvantage of the active overvoltage protection described is that the detection elements have to be designed for the entire reverse voltage of the power semiconductor. Moreover, a high-impedance voltage divider continually causes a power loss, whereas a high-blocking-capability zener diode is thermally endangered by the power loss converted in it. Moreover, high-blocking-capability components are expensive.

German patent specification 196 10 135 C1 discloses a cascode circuit of two voltage-controlled semiconductor switches which are electrically connected in series. This cascode circuit is described below with reference to FIG. 1 of the drawings.

In FIG. 1, cascode circuit 2 has a low-blocking-capability semiconductor switch 4 and a high-blocking-capability semiconductor switch 6, which are electrically connected in series. A normally off n-channel MOSFET, in particular a low-voltage power MOSFET, is provided as the low-blocking-capability semiconductor switch 4, and an n-channel junction FET is provided as the high-blocking-capability semiconductor switch 6. This high-blocking-capability junction FET 6 is also referred to as Junction Field-Effect Transistor (JFET). The two FETs 4 and 6 are electrically connected in series in such a way that the source terminal of the JFET 6 is electrically conductively connected directly to the drain terminal D' of the MOSFET 4 and the gate terminal of the JFET 6 is electrically conductively connected to the source terminal S of the MOSFET 4 by means of a gate resistor $R_{GJ}$. This electrical interconnection of two semiconductor components is referred to as a cascode circuit, as is known. Since respective FETs are used as the semiconductor switches 4 and 6 of the cascode circuit 2, this cascode circuit 2 is also referred to as a hybrid power MOSFET. The low-blocking-capability MOSFET 4 of this cascode circuit 2 has an internal biplar diode $D_{IN}$, which is reverse-connected in parallel with the MOSFET 4 and is generally referred to as an inverse diode or internal free-wheeling diode. The normally off n-channel MOSFET 4 is made of silicon, whereas the normally off n-channel JFET 6 is preferably composed of silicon carbide. This hybrid power MOSFET 2 is designed for a high reverse voltage of more than 1000 V and nevertheless has only small losses in the on-state range.

FIGS. 2 and 3 illustrate blocking characteristic curves of the normally on n-channel JFET 6 and of the normally off n-channel MOSFET 4, respectively, in a plot of reverse current against reverse voltage. Since the low-blocking-capability and high-blocking-capability semiconductor switches 4 and 6 are electrically connected in series in the cascode circuit 2, the current through both semiconductor switches 4 and 6 must be of the same magnitude. Moreover, the reverse voltage $U_{DSA}$ of the low-blocking-capability semiconductor switch 4 is present as gate voltage at the high-blocking-capability semiconductor switch 6 of the cascode circuit 2. If a reverse voltage $U_{DSA}$ is then present at the turned-off cascode circuit 2, it will be divided between the two semiconductor circuits 4 and 6 of the cascode circuit 2. This division will be effected such that the same reverse current $I_{DA}$ is established for both semiconductor switches. A stable operating point AP will be established in this way.

If, from a stable operating point AP of the cascode circuit 2, the value of the reverse voltage $U_{D'SA}$ of the low-blocking-capability semiconductor switch 4 should shift to low values, then the reverse current $I_{DA}$ would likewise have to decrease in accordance with the blocking characteristic curve according to FIG. 3. For the high-blocking-capability semiconductor switch 6, this means only a marginal change in its reverse voltage $U_{DSA}$, since the latter is significantly greater than the reverse voltage $U_{D'SA}$ of the low-blocking-capability semiconductor switch 4. A decrease in the reverse voltage $U_{D'SA}$ of the low-blocking-capability semiconductor switch 4 of the cascode circuit 2 likewise means a decrease in the magnitude of the gate voltage of the high-blocking-capability semiconductor switch 6. A reduced-magnitude gate voltage of the high-blocking-capability semiconductor switch 6 means an increased reverse current $I_{DA}$ (FIG. 2). However, this increased reverse current $I_{DA}$ can only be carried by the low-blocking-capability semiconductor switch 4 of the cascode circuit 2 if said switch takes up a larger reverse voltage. Consequently, the previously conceived decrease in the reverse voltage $U_{D'SA}$ of the low-blocking-capability semiconductor switch 4 of the cascode circuit 2 is cancelled.

This fact can be utilized for overvoltage identification, a low-voltage signal being used to detect an overvoltage at high potential.

SUMMARY OF THE INVENTION

The invention has as its object, the ability to detect an overvoltage at high potential by means of a low-voltage signal.

By virtue of the fact that when a switch-off signal arrives, the gate voltage of the low-blocking-capability semiconductor switch is controlled in such a way that its drain voltage is held constant in an active range of the low-blocking-capability semiconductor switch of the cascode circuit, a low-voltage signal is obtained which indicates whether an overvoltage occurs at high potential of the cascode circuit.

Since drain voltage of the low-blocking-capability semiconductor switch of the cascode circuit is held constant in the active range, only the drain current through the cascode circuit can rise when an overvoltage occurs, owing to the constant gate voltage. This current rise can only be carried by the low-blocking-capability semiconductor switch of the cascode circuit if, at constant drain voltage, the gate voltage is altered in such a way that the low-blocking-capability semiconductor switch is turned on again. In other words, the direction of the gate voltage change is changed. This change in the gate voltage is tapped off at low potential and is an indication of the occurrence of an overvoltage at high potential of the cascode circuit.

In addition to a predetermined desired value, the actual value of the drain voltage is also required for controlling the drain voltage of the low-blocking-capability semiconductor switch of the cascode circuit and this required low-voltage signal can also be evaluated with regard to overvoltage detection. In the normal case, the value of this drain voltage actual value that has been determined corresponds approximately to the value of the drain voltage desired value. If an overvoltage occurs during switch-off or in the off state of the cascode circuit, then the actual value of the drain voltage of the low-blocking-capability semiconductor switch of the cascode circuit rises rapidly. This rise in the actual value of the drain voltage is then an indication of the overvoltage at high potential of the cascode circuit.

The apparatus for turning off a cascode circuit, according to the invention, comprises a control loop, including a comparator and a controller, which, when the cascode circuit is turned off and optionally also in the switched-off state, is linked to the gate terminal of the low-blocking-capability semiconductor switch of said cascode circuit. At low potential, the control loop offers a plurality of signals which can be evaluated for overvoltage detection. The signal which is offered for overvoltage detection depends on the configuration of the controller or on the dynamic range of the control loop. A sign change in the drain voltage difference value is an indication of the occurrence of an overvoltage at high potential of the cascode circuit. Alternatively, the rise in the actual value of the drain voltage of the low-blocking-capability semiconductor switch can be used as a detector signal with regard to the occurrence of an overvoltage at high potential of the cascode circuit.

With the method according to the invention for turning off a cascode circuit, the occurrence of an overvoltage at high potential of the cascode circuit can be detected with the aid of a low-potential signal, the cascode circuit converting the energy of the overvoltage into heat. At the end of the switch-off operation, the high-blocking-capability semiconductor switch and the low-blocking-capability semiconductor switch are in the off state. In the off state, the drain voltage of the low-blocking-capability semiconductor switch is either controlled to a predetermined constant value by way of its gate voltage or is set to an arbitrary value with the gate turned off.

Consequently, it is possible not only to detect an overvoltage at high potential by means of the method according to the invention for turning off a cascode circuit, but simultaneously to actively limit this overvoltage.

BRIEF DESCRIPTION OF THE DRAWINGS

The invention is described in detail below in conjunction with the appended drawings, in which.

DETAILED DESCRIPTION OF THE INVENTION

Figure 1:
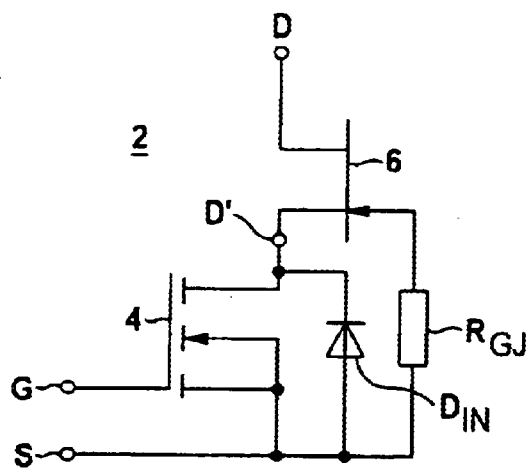
FIG. 1 shows the circuit of a known hybrid power MOSFET.
Figure 2:
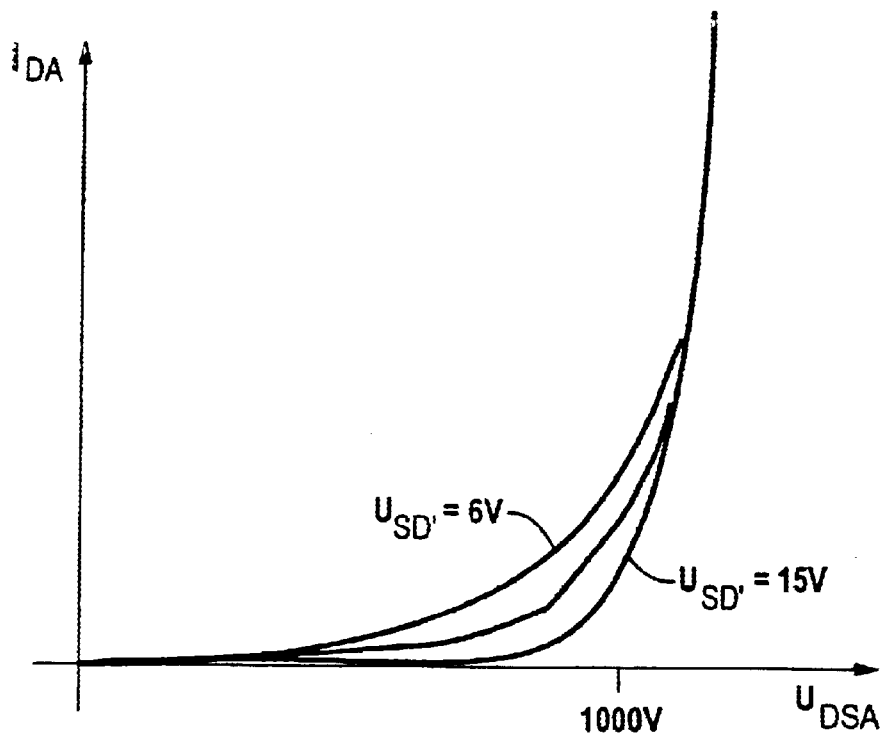
FIG. 2 is a plot of the barriers characteristic curves of the high-barrier semiconductor switch JFET.
Figure 3:
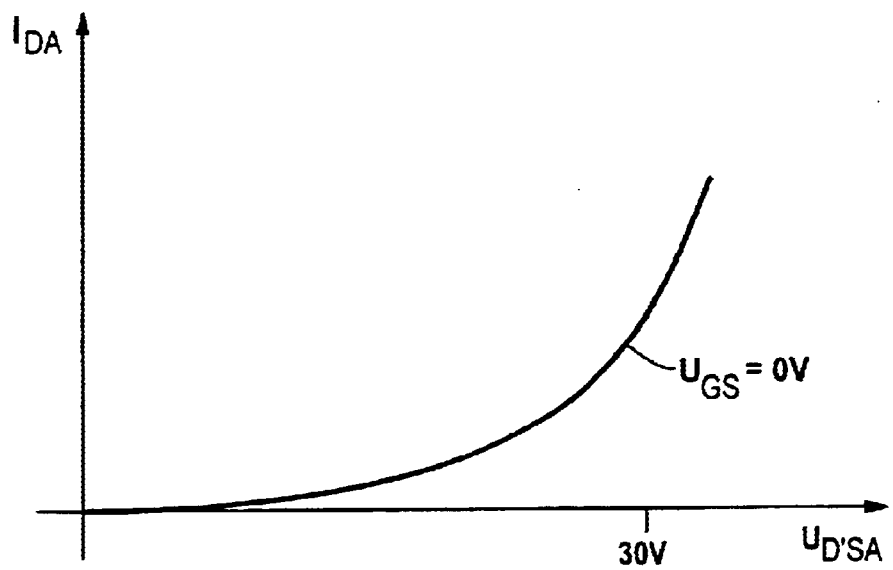
FIG. 3 is a graph of the barrier characteristic of the low-barrier semiconductor switch MOSFET.
Figure 4:
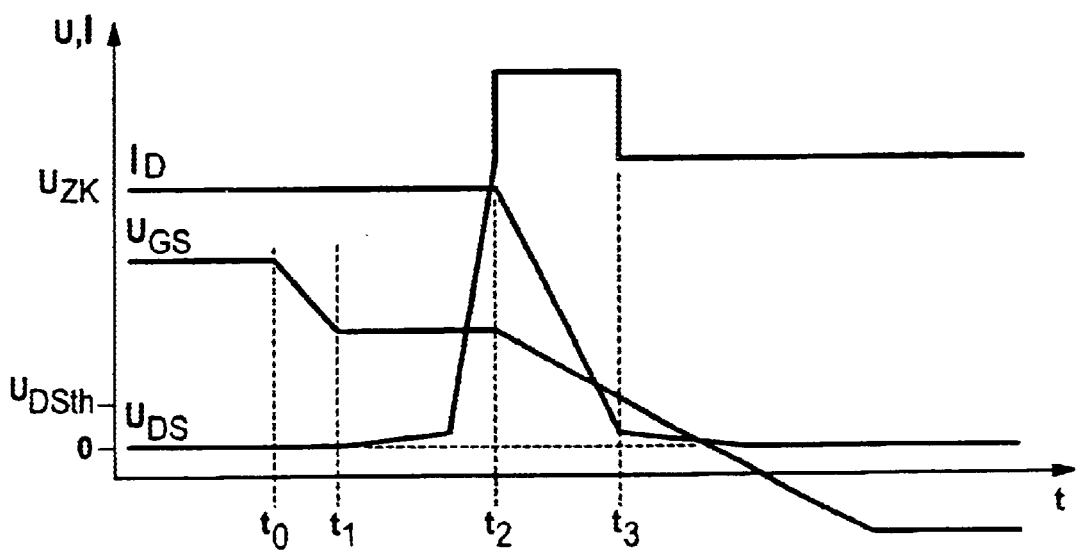
FIG. 4 shows, in a plot against time t, a switch-off operation of a cascode circuit.

FIG. 4 diagrammatically illustrates a turn-off operation of a power MOSFET. In order to be able to turn off a power MOSFET, the potential of the gate G must be discharged to source potential. The gate potential is generally put at negative potential (relative to the source) in order to counteract interference. The gate G is discharged via a gate discharge resistor, which may also simultaneously be the gate charging resistor. The discharge operation begins at time t0 and initially falls as far as the so-called Miller Plateau (time $t_1$), which is dependent on the load current. Here, firstly the parasitic capacitances are subjected to charge reversal. The drain-source voltage $U_{DS}$ rises at time $t_1$ (Miller Plateau). If the drain-source voltage $U_{DS}$ reaches the value of the intermediate circuit voltage $U_{ZK}$ (time $t_2$), then a freewheeling diode can accept the current from the power MOSFET and the drain current $I_D$ falls. The gate-source voltage $U_{GS}$ falls simultaneously. The current fall time can be influenced by a type of driving (low or high discharge current of the control capacitance) and ends at the time $t_3$. From this time $t_3$, only a tail current flows through the power MOSFET, the tail current resulting from the stored charge of the component. In contrast to the previous phases of the turn-off operation, the tail current is not influenced by means of the control. During the current fall, the drain-source voltage $U_{DS}$ at the power MOSFET exceeds the intermediate circuit voltage $U_{ZK}$ in a manner governed by leakage inductances. The turn-off operation can be influenced by changing the value of the gate discharge resistor. A small resistance means a large current flow from the gate G of the power MOSFET and, consequently, fast charge reversal, a higher rate of voltage rise and a higher rate of current fall during the individual switching operations.

Figure 5:
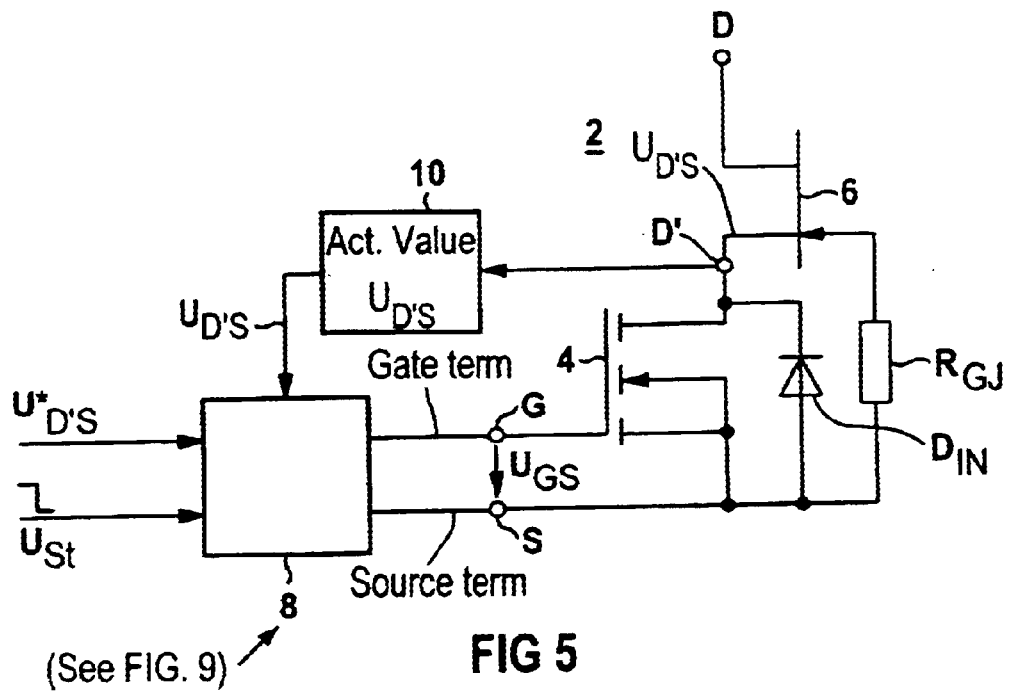
FIG. 5 illustrates an apparatus according to the invention.

FIG. 5 shows a known cascode circuit 2 with an apparatus 8 according to the invention. On the output side, the apparatus 8 is linked to the gate and source terminals G and S of the low-blocking-capability semiconductor switch 4 of the cascode circuit 2. A drain voltage actual value $U_{D'S}$ of the low-blocking-capability semiconductor switch 4 of the cascode circuit 2 is present at an actual value input of the apparatus 8, whereas a drain voltage desired value $U^*_{D'S}$ is present at the desired value input. A switch-off command $U_{st}$ is present at a control input, which command activates apparatus 8. The drain voltage actual value $U_{D'S}$ is determined in a known manner by means of a device 10. On its input side, the device 10 is linked to the drain terminal D' of the low-blocking-capability semiconductor switch 4 of the cascode circuit 2. The control loop structure of this embodiment is illustrated in greater detail in FIG. 9.

Figure 6:
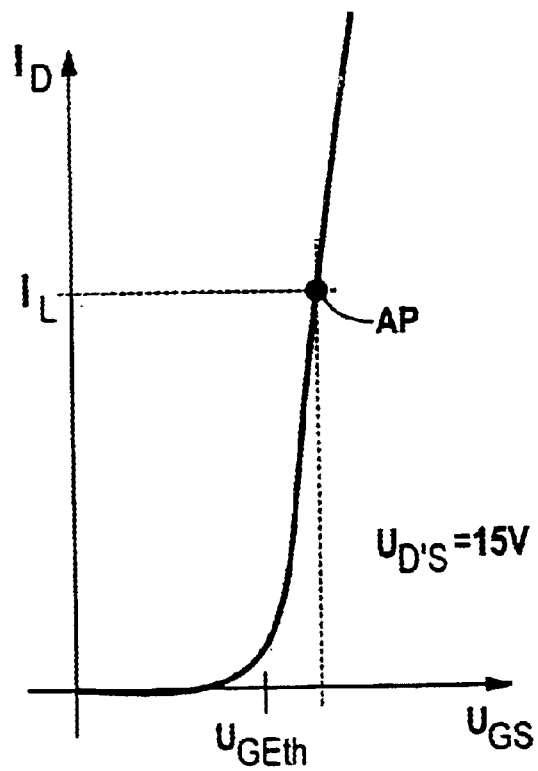
FIG. 6 illustrates a control characteristic curve of the low-blocking-capability semiconductor switch of the cascode circuit.
Figure 7:
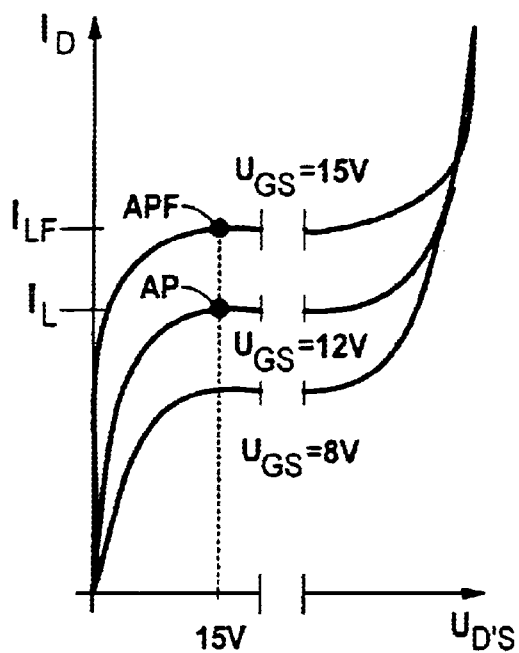
FIG. 7 shows an output characteristic curve of the low-blocking-capability semiconductor switch of the cascode circuit of FIG. 1.

A control characteristic curve of a normally off n-channel MOSFET 4 of the cascode circuit 2 for a constant drain voltage $U_{D'S}$ of 15 V, for example, is illustrated in greater detail in a plot against the gate voltage $U_{GS}$ in FIG. 6. An operating point AP is established as a function of a load current $I_L$. Associated output characteristic curves of the normally off n-channel MOSFET 4 of the cascode circuit 2 are illustrated in the diagram of FIG. 7. In accordance with this family of output characteristic curves, each output characteristic curve is assigned a gate voltage $U_{GS}$. The family of output characteristic curves of the normally on n-channel JFET 6 of the cascode circuit 2 illustrated in FIG. 8 corresponds to the family of output characteristic curves of the normally off n-channel MOSFET 4. The differences between this family of characteristic curves and the family of characteristic curves of FIG. 7 are that the blanked-out region is significantly larger, and that the gate voltage $U_{GS}$ has shifted by approximately 15 V to low values. The gate voltage $U_{GS}$ of the normally on n-channel JFET 6 is equal to the negative drain voltage $U_{D'S}$ of the normally off n-channel MOSFET 4 of the cascode circuit 2.

Figure 9:
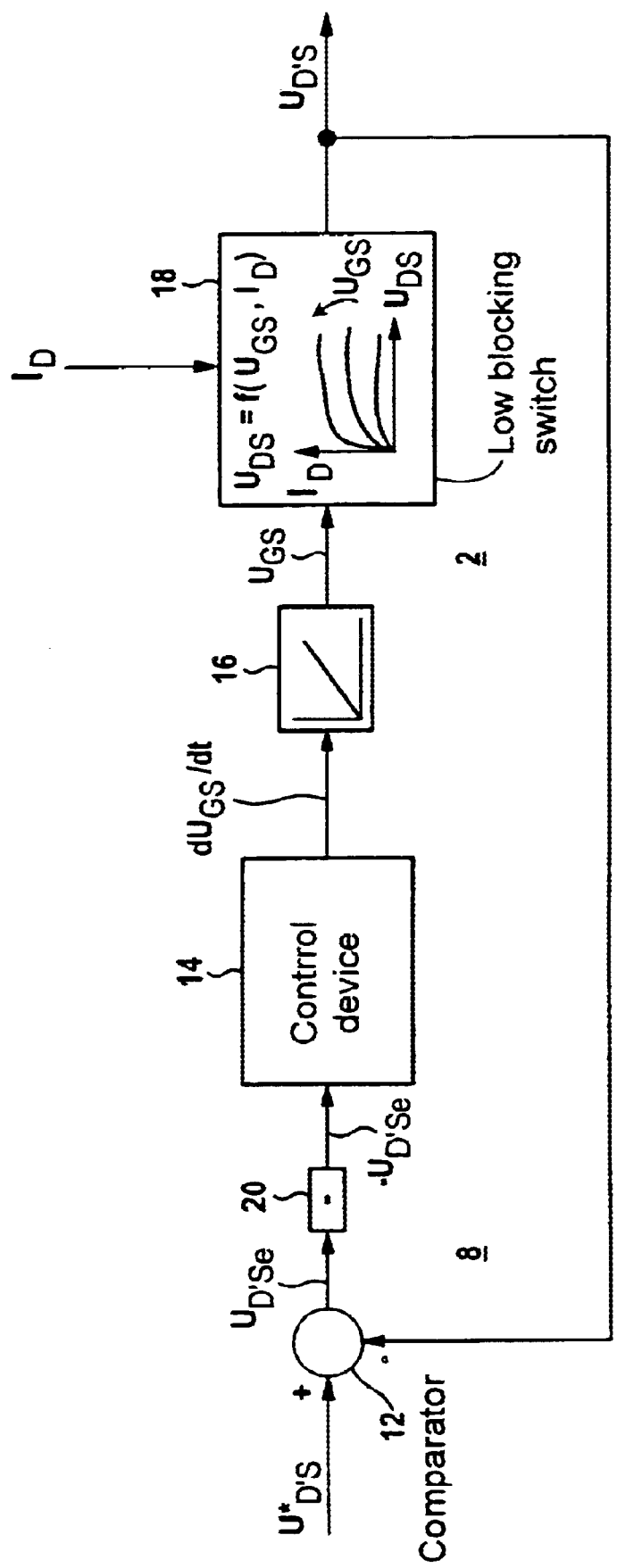
FIG. 9 illustrates the structure of the control loop in accordance with FIG. 5 in greater detail.

FIG. 9 shows a control loop arrangement for the low-blocking-capability semiconductor switch 4 with the apparatus 8 of FIG. 5. The apparatus 8 includes a comparator 12 and a control device 14. The low-blocking-capability semiconductor switch 4 of the cascode circuit 2 is represented by an integrator 16 and a characteristic curve generator 18. The integrator 16 represents the input capacitance at the control input of the low-blocking-capability semiconductor switch 4 of the cascode circuit 2. The characteristic curve generator 18 has the output characteristic curves of the low-blocking-capability semiconductor switch 4 of the cascode circuit 2.

To that end, the drain current $I_D$ flowing through the cascode circuit 4 is also fed to the characteristic curve generator 18. On the output side, the characteristic curve generator 18 is linked to the inverting input of the comparator 12, a drain voltage desired value $U^*_{D'S}$ being present at the noninverting input of said comparator. The output of said comparator 12 is connected to an input of the control device 14 by means of a sign change device 20.

Figure 10:
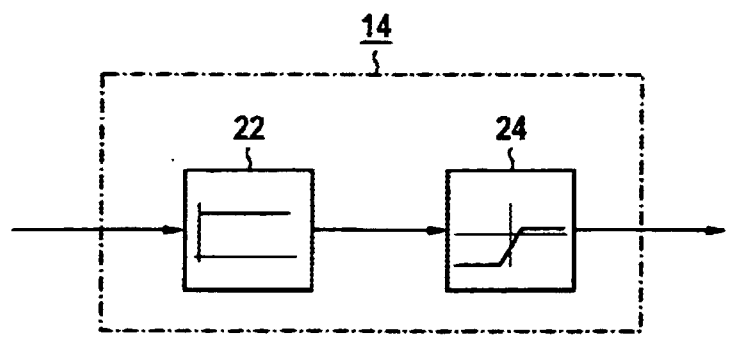
FIG. 10 illustrates a preferred embodiment of the controller according to FIG. 9.

In accordance with FIG. 10, an embodiment of the control device 14 has a controller 22 and a limiter device 24. The limiter device 24 can be dispensed with without changing the turn-off method. In the embodiment in accordance with FIG. 10, a proportional controller, also referred to as P controller, is provided as the controller 22.

The method according to the invention for turning off a cascode circuit 2, comprising a low-blocking-capability and high-blocking-capability semiconductor switch 4 and 6, will now be explained in more detail with reference to FIGS. 9 and 10 in conjunction with FIGS. 4 and 6 to 8:

At the beginning of the turn-off operation (time interval $t_0$–$t_2$ of FIG. 4), the gate voltage $U_{GS}$ of the normally off n-channel MOSFET 4 is controlled in such a way that the drain voltage $U_{D'S}$ of the normally off n-channel MOSFET 4 is held constant in the active range. To that end, a drain voltage desired value $U^*_{D'S}$ of 15 V, for example, is prescribed. In accordance with the control characteristic curve of FIG. 6, the operating point AP is established with this drain voltage $U_{D'S}=15$ V and a load current $I_L$. For the normally on n-channel JFET 6 of the cascode circuit 2, this drain voltage $U_{D'S}$—controlled to 15 V—of the normally off n-channel MOSFET 4 acts as input voltage at its gate. The turn-off operation of the JFET 6 is initiated by the gate resistor $R_{GJ}$ and the input capacitance (not specifically illustrated) of the normally on n-channel JFET 6.

After the time delay determined as a function of the gate resistor $R_{GJ}$ has elapsed, the controlled drain voltage $U_{D'S}$ of the MOSFET 4 with opposite polarity is present at the gate of the JFET 6, so that the JFET 6 is switched off. The method proceeds in this manner if, for example, no impermissible overvoltage occurs at the instant $t_2$ (FIG. 4).

Figure 8:
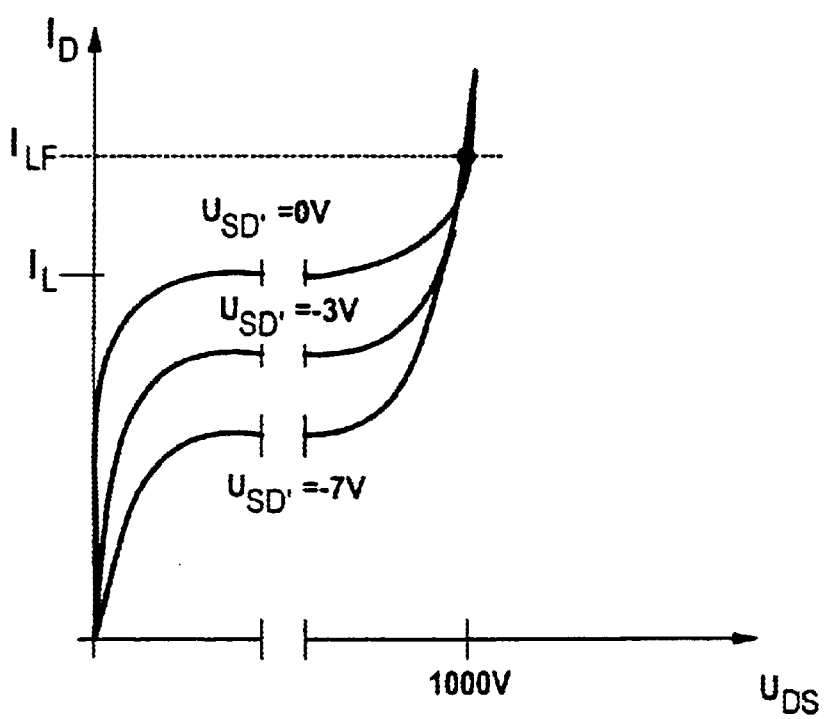
FIG. 8 shows an output characteristic curve of the high-blocking-capability semiconductor switch of the cascode circuit of FIG. 1.

However, if an impermissible overvoltage occurs at the normally on n-channel JFET 6 of the cascode circuit 2 in time interval $t_2$–$t_3$ (FIG. 4), then the load current $I_L$ rises to $I_{LF}$. The operating point of the JFET 6 has shifted in the region of the exponentially rising curves when an impermissible overvoltage occurs (FIG. 8). This current rise can be carried by the normally off n-channel MOSFET 4 of the cascode circuit 2 only when said MOSFET 4 is turned on again. In accordance with FIG. 7, by way of example, MOSFET 4 is at the operating point AP before the instant $t_2$. After this instant $t_2$, the MOSFET 4 is at the operating point APF, since the elevated load current $I_{LF}$ now flows through the cascode circuit 2. Since the drain voltage $U_{D'S}$ of the normally off n-channel MOSFET 4 of the cascode circuit 2 is controlled to 15 V, for example, by the method, this MOSFET 4 can carry the elevated current $I_{LF}$ only when the gate voltage $U_{GS}$ is increased again from 12 V to 15 V. This means reversing the gate voltage change $dU_{GS}/dt$. As a result of the MOSFET 4 of the cascode circuit 2 being turned on again, the energy of the impermissible overvoltage is actively converted into heat in the cascode circuit 2. In other words, when an impermissible overvoltage occurs, it is actively limited by the turn-off method according to the invention.

Since the gate voltage change $dU_{GS}/dt$ is not reversed in the fault-free turn-off operation, the current change toward larger values is detected by the reversal of the gate voltage change $dU_{GS}/dt$. Consequently, this signal indicates an impermissible overvoltage at high potential without the need to evaluate the voltage at high potential.

With a small modification of the present apparatus (FIG. 9) for turning off a cascode circuit 2, it is also possible to detect an overvoltage, for example an external mains overvoltage, in the off state of the cascode circuit 2. To that end, the output signal $U_{GS}$ of the integrator 16 is set to a start value which reliably turns off the normally off n-channel MOSFET 4. Generally, it is possible to use the value of the negative supply voltage of the drive circuit. A drain voltage $U_{D'S}$ is established because of this negative voltage value of the gate voltage $U_{GS}$ of the low-blocking-capability n-channel MOSFET 4. The drain voltage $U_{D'S}$ that is established in the low-blocking-capability n-channel MOSFET in the off state is used as the drain voltage desired value $U^*_{D'S}$. Consequently, the control loop is in operation again. If, owing to a rise in the reverse voltage of the cascode circuit 2, the drain voltage actual value $U_{D'S}$ of the low-blocking-capability n-channel MOSFET 4 also rises, a control difference $U_{D'Se}$ other than zero appears at the input of the control device 14. This control difference $U_{D'Se}$ other than zero indicates that, in the static blocking case, an overvoltage is present at the cascode circuit 2. Consequently, with this above-described modification of the apparatus according to the invention, it is possible to detect an overvoltage at the cascode circuit 2 in the static blocking case without having to use the high-voltage terminal of the cascode circuit 2 for actual value detection.

If a control device 14 in accordance with FIG. 10 is used, then, although the gate voltage $U_{GS}$ of the MOSFET 4 of the cascode circuit 2 can be rapidly decreased, it cannot be rapidly increased. As a result, the drain voltage $U_{D'S}$ of the MOSFET 4 will rise rapidly at the gate voltage $U_{GS}$, which is now constant. This signal can also be utilized for identifying an impermissible overvoltage. As soon as an impermissible overvoltage has been detected by means of the drain voltage actual value $U_{D'S}$, the limiter device 24 must be deactivated for limiting the overvoltage. The overvoltage is again limited by the MOSFET 4 of the cascode circuit 2 being slightly turned on again until the end of the switching operation.

Figure 11:
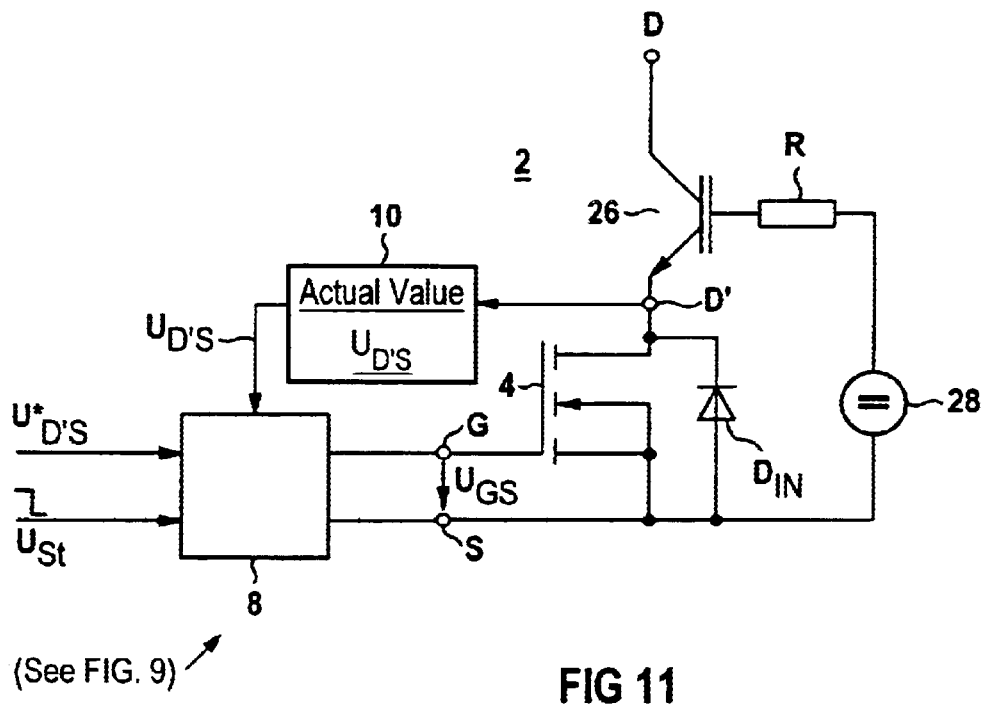
FIG. 11 shows an apparatus according to the invention with a further embodiment of the cascode circuit.

FIG. 11 shows an apparatus according to the invention with a further embodiment of the cascode circuit 2. Compared with the embodiment of FIG. 5, this embodiment of the cascode circuit 2 differs only in that a voltage-controlled semiconductor switch 26 is provided instead of a JFET 6 as the high-blocking-capability semiconductor switch. When a voltage-controlled semiconductor switch 26 is used as the high-blocking-capability semiconductor switch 6 of the cascode circuit 2, a gate terminal of this voltage-controlled semiconductor switch 26 is connected to the source terminal S of the low-blocking-capability semiconductor switch 4 of the cascode circuit 2 by means of a gate resistor R and a constant-voltage source 28. A DC voltage source, for example a battery of about 15 V, is used as the constant-voltage source 28. By way of example, an Insulated Gate Bipolar Transistor (IGBT), a MOSFET or a MOS-controlled thyristor (MCT), can be used as the voltage-controlled semiconductor switch 26, the illustration here showing only an IGBT as the high-blocking-capability semiconductor switch 6 of the cascode circuit 2. The use of a voltage-controlled semiconductor switch 26 as the high-blocking-capability semiconductor switch 6 of the cascode circuit 2 does not cause any change in the functioning of the apparatus 8.

What is claimed is:

1. A method for turning-off a cascode circuit consisting of a low-barrier and high-barrier semiconductor switch in series, wherein upon arrival of a switch-off command, an ascertained drain voltage of the low-barrier semiconductor switch is regulated to a predetermined value in an active range of the low-barrier semiconductor switch of the cascode circuit.

2. The method according to claim 1, wherein the predetermined value of the ascertained drain voltage of the low-barrier semiconductor switch in the active range is 15V.

3. Apparatus for turning off a cascode circuit having a low-blocking-capability semiconductor switch and a high-blocking-capability semiconductor switch connected in series, comprising an enabling circuit having an output terminal coupled to the gate terminal of said low-blocking-capability semiconductor switch and input terminals for receiving a turn-off signal, an actual value of drain voltage of said low-blocking-capability semiconductor switch and a desired value of drain voltage for said low-blocking-capability semiconductor switch, respectively, and a loop circuit coupling the gate terminal of said low-blocking-capability semiconductor switch to said actual drain voltage value input terminal of said control circuit.

4. Apparatus as claimed in claim 3, wherein said enabling circuit comprises a comparator for receiving said actual and desired values of drain voltage, a controller for providing a control signal to said low-blocking-capability semiconductor switch, and means coupling the output of said comparator to the input of said controller.

5. The apparatus as claimed in claim 3, wherein the low-blocking-capability semiconductor switch is a MOSFET and the high-blocking-capability semiconductor switch is a JFET, the gate terminal of the JFET being linked to the source terminal of the MOSFET by means of a gate resistor.

6. The apparatus as claimed in claim 4, wherein the controller (22) is a proportional controller.

7. The apparatus as claimed in claim 3, wherein, the low-blocking-capability semiconductor switch is a MOSFET and the high-blocking-capability semiconductor switch is a voltage-controlled semiconductor switch, the gate terminal of the voltage-controlled semiconductor switch being linked to the source terminal of the MOSFET by means of a constant-voltage source.

8. The apparatus as claimed in claim 6, wherein the voltage-controlled semiconductor switch is an insulated gate bipolar transistor.

9. The apparatus as claimed in claim 6, wherein the voltage-controlled semiconductor switch is a MOS-controlled thyristor.

10. The apparatus as claimed in claim 3, wherein the low-blocking-capability semiconductor switch is composed of silicon and the high-blocking-capability semiconductor switch is composed of silicon carbide.

* * * * *